United States Patent
Raghunathan et al.

(10) Patent No.: US 8,164,369 B2
(45) Date of Patent: *Apr. 24, 2012

(54) TECHNIQUES FOR MINIMIZING CONTROL VOLTAGE NOISE DUE TO CHARGE PUMP LEAKAGE IN PHASE LOCKED LOOP CIRCUITS

(75) Inventors: Ashwin Raghunathan, Santa Clara, CA (US); Marzio Pedrali-Noy, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 121 days.

This patent is subject to a terminal disclaimer.

(21) Appl. No.: 12/367,980

(22) Filed: Feb. 9, 2009

(65) Prior Publication Data
US 2010/0117701 A1 May 13, 2010

Related U.S. Application Data

(60) Provisional application No. 61/114,041, filed on Nov. 12, 2008.

(51) Int. Cl.
*H03L 7/06* (2006.01)
(52) U.S. Cl. .......................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 5,920,233 A * | 7/1999 | Denny | ............................. | 331/14 |
| 6,262,610 B1 * | 7/2001 | Lo et al. | ........................ | 327/157 |
| 6,356,122 B2 * | 3/2002 | Sevalia et al. | ................. | 327/105 |
| 6,611,161 B1 * | 8/2003 | Kumar et al. | ................. | 327/157 |
| 6,806,750 B1 * | 10/2004 | Rasmussen et al. | .......... | 327/156 |
| 6,963,232 B2 * | 11/2005 | Frans et al. | .................... | 327/156 |
| 7,038,509 B1 * | 5/2006 | Zhang | ........................... | 327/157 |

(Continued)

FOREIGN PATENT DOCUMENTS
EP 1511174 A1 3/2005

OTHER PUBLICATIONS

International Search Report—PCT/US2009/064269—International Search Authority, European Patent Office, Dec. 28, 2009.

(Continued)

*Primary Examiner* — Lincoln Donovan
*Assistant Examiner* — Adam Houston
(74) *Attorney, Agent, or Firm* — Eric Ho

(57) ABSTRACT

Techniques for adaptively control of a loop filter sampling interval to mitigate the effects of charge pump output noise in an apparatus including a phase lock loop circuit are provided. In one aspect, the apparatus includes a voltage controlled oscillator (VCO), a phase frequency detector (PFD) providing a phase comparison operation, a loop filter providing a control voltage to lock the VCO to a desired operating frequency, and a charge pump configured to provide an output signal to the loop filter in response to at least one of an UP pulse and a DOWN pulse. The apparatus further includes a sampling switch, coupled between an input of the loop filter, an output of the charge pump, and characterized by a sampling interval. A sampling switch controller is configured to adaptively control the width of the sampling interval in order to mitigate the effects of output noise from the charge pump by closing the sampling switch in advance of the phase comparison operation and opening the sampling switch when the phase comparison operation is completed.

38 Claims, 5 Drawing Sheets

U.S. PATENT DOCUMENTS

| | | | |
|---|---|---|---|
| 7,132,865 B1 * | 11/2006 | Terrovitis et al. | 327/157 |
| 7,132,896 B2 * | 11/2006 | Boerstler et al. | 331/16 |
| 7,148,764 B2 * | 12/2006 | Kasahara et al. | 331/179 |
| 7,209,009 B2 * | 4/2007 | Steinbach et al. | 331/16 |
| 7,248,086 B2 * | 7/2007 | Frans et al. | 327/147 |
| 7,265,636 B2 | 9/2007 | Dedieu et al. | |
| 7,317,345 B2 * | 1/2008 | Sanchez et al. | 327/527 |
| 7,446,595 B2 * | 11/2008 | Lee et al. | 327/536 |
| 7,449,928 B2 | 11/2008 | Kobayashi | |
| 7,671,642 B2 * | 3/2010 | Payrard et al. | 327/140 |
| 2003/0038661 A1 * | 2/2003 | Chokkalingam et al. | 327/157 |
| 2005/0248376 A1 * | 11/2005 | Boerstler et al. | 327/156 |
| 2006/0197563 A1 * | 9/2006 | Sanchez et al. | 327/156 |
| 2009/0102526 A1 * | 4/2009 | Yoneda | 327/158 |
| 2010/0085089 A1 * | 4/2010 | Weng et al. | 327/156 |

OTHER PUBLICATIONS

Written Opinion—PCT/US2009/064269—International Search Authority European Patent Office—Dec. 28, 2009.

* cited by examiner

TECHNIQUES FOR MINIMIZING CONTROL VOLTAGE NOISE DUE TO CHARGE PUMP LEAKAGE IN PHASE LOCKED LOOP CIRCUITS

RELATED APPLICATIONS

CLAIM OF PRIORITY UNDER 35 U.S.C. §119

The present Application for Patent claims priority to Provisional U.S. Application Ser. No. 61/114,041, entitled "TECHNIQUES FOR MINIMIZING CONTROL VOLTAGE RIPPLE AND NOISE DUE TO CHARGE PUMP LEAKAGE IN PHASE LOCKED LOOP CIRCUITS," filed Nov. 12, 2008, assigned to the assignee hereof, and expressly incorporated herein by reference.

REFERENCE TO CO-PENDING APPLICATION FOR PATENT

The present Application for Patent is related to the following co-pending U.S. Patent Application 12/367,969, entitled, "TECHNIQUES FOR MINIMIZING CONTROL VOLTAGE RIPPLE DUE TO CHARGE PUMP LEAKAGE IN PHASE LOCKED LOOP CIRCUITS", having , filed concurrently herewith, assigned to the assignee hereof, and expressly incorporated by reference herein.

TECHNICAL FIELD

The present disclosure relates generally to the field of electronic circuits, and more specifically to phase lock loop circuits.

BACKGROUND

FIG. 1 shows a schematic diagram of a typical phase lock loop (PLL) circuit employing a charge pump. A typical PLL circuit 100 consists of a phase frequency detector (PFD) 104 which detects a phase error, via a phase comparison, between a reference clock signal, denoted as REF_CLK, and a divided output clock from a divide-by-N divider 124. The PFD 104 generates and outputs UP and DOWN signals which drive a charge pump 106. The charge pump 106 injects a charge proportional to the detected phase error into a loop filter 116. The loop filter 116 then generates a control voltage $V_{ctrl}$ (or current) that is an input to a voltage (or current) controlled oscillator (VCO) 122. The VCO 122 generates a VCO output signal, denoted as VCO_CLK, whose frequency is proportional to the control voltage $V_{ctrl}$. It should be noted that the PFD 104 is clocked by the reference clock signal REF_CLK; i.e. the phase comparisons occur at the reference frequency interval.

The reference clock signal REF_CLK is a function of a clock signal from an external reference oscillator (not shown) and may be a fraction of the external reference oscillator frequency, the fraction being derived by a divider (not shown) in a path between the external reference oscillator and the PFD 104.

In a locked condition, the UP and DOWN pulses are of substantially equal duration and no net charge is injected into the loop filter 116. Hence the control voltage $V_{ctrl}$ (or current) is ideally at a constant value which ensures that the VCO output signal VCO_CLK is at a constant frequency. The loop filter 116 typically accumulates a charge to produce a filtered control voltage that adjusts the VCO 122 output frequency.

The loop filter 116 is shown to include a first order loop filter implementation that comprises a series combination of a resistor ($R_{FILT}$) 118 and a capacitor ($C_{FILT}$) 120 in parallel with the charge pump 106 output. The loop filter 116 is only exemplary and may also include other components. For example, commonly an extra pole capacitor (not shown) is placed in parallel with the charge pump 106 output. The extra pole capacitor may be ⅒ the value of capacitor 120. The extra pole capacitor does not affect PLL 100 settling time or loop stability, but improves reference spur rejection in the VCO 122 output signal.

The charge pump 106 includes current sources 108 and 114 and switches 110 and 112. The switch 110 when closed passes the UP pulse to the loop filter 1 16. The switch 112 passes the DOWN pulse to the loop filter 116 when closed. The output of the PFD 104 controls the charge pump 106 so as to increase or decrease the control voltage $V_{ctrl}$ (or current) to the VCO 122 input.

FIG. 2 shows a set of waveforms 200 for a reference clock signal REF_CLK, a divider clock signal DIV_CLK, a VCO 122 output signal VCO_CLK, UP and DOWN pulses from phase-frequency detector PFD 104, and a control voltage $V_{ctrl}$ "noise" associated with the PLL circuit 100 of FIG. 1. The waveform of the control voltage $V_{ctrl}$ illustrates that noise from the charge pump and preceding blocks may affect the time jitter of the VCO 122 output signal VCO_CLK. The waveform of the control voltage $V_{ctrl}$ is measured at a node $V_{ctrl}$ of the loop filter 116. The loop filter 116 output voltage is the control signal to the VCO 122, and any disturbances on this signal result in increased jitter (in the time domain) or increased phase noise (in the frequency domain) at the VCO 122 output. Jitter/phase noise can be random or deterministic depending on the source of the disturbance. Examples of such activity may be device noise in the charge pump 116, power supply ($V_{DD}$) white noise or switching noise, periodic or random noise coupling into the charge pump 116 from surrounding analog and digital circuits.

In current nanometer processes, the leakage and noise currents of a transistor can be quite significant. The charge pump 106 within PLL 100 is typically implemented using transistor based current sources that are turned on for the duration of the UP or DOWN pulses and are turned off otherwise. However the leakage current of these transistors can introduce noise from the VDD and GND connections to the charge pump 116 even when the charge pump current sources are turned off. The noise current introduces voltage "noise" on the control voltage $V_{ctrl}$ to the voltage controlled oscillator (VCO 122) which manifests as a combination of deterministic and random jitter (depending on the noise source) in the time domain or phase noise/reference spurs in the frequency domain on the VCO 122 output signal VCO_CLK. The jitter effects can be undesirable depending on the target application. The undesirable jitter effects are further exacerbated in low voltage designs that typically use high voltage or current gain VCO architectures to maximize the tuning range (i.e. to generate a wide range of frequencies from a limited control voltage or current range). With greater tuning range in the VCO 122, the output noise of charge pump 116, $I_{NOISE}$, will introduce more time jitter to the VCO_CLK signal.

In one solution to lower the charge pump leakage current and output noise, thick-oxide transistors are employed in the charge pump. However, the option of using thick-oxide transistors may not be available in a particular integrated circuit process technology or may require the use of costly extra mask process steps. In another solution, a large loop capacitance and power supply decoupling capacitance are used to minimize voltage noise for a given output noise current which results in an integrated circuit area, slow PLL settling time, and die cost penalty.

There is therefore a need to mitigate charge pump output noise current without the expense of thick oxide transistors or a large loop capacitor on-chip and to minimize the integrated circuit cost and die area penalty for improved VCO output time jitter and phase noise.

SUMMARY

Techniques to adaptively control the loop filter sampling interval to mitigate the effects of charge pump output noise current in an apparatus including a phase lock loop circuit are provided. In one aspect, the apparatus includes a voltage controlled oscillator (VCO), a phase frequency detector (PFD) providing a phase comparison operation, a loop filter configured to provide a control voltage to lock the VCO to a desired operating frequency, and a charge pump configured to provide an output signal to the loop filter in response to at least one of an UP pulse and a DOWN pulse. The apparatus further includes a sampling switch, coupled between an input of the loop filter, an output of the charge pump, and characterized by a sampling interval. A sampling switch controller is configured to adaptively control the width of the sampling interval in order to mitigate the effects of output noise current from the charge pump by closing the sampling switch in advance of the phase comparison operation and opening the sampling switch when the phase comparison operation is completed.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

Figure 1:
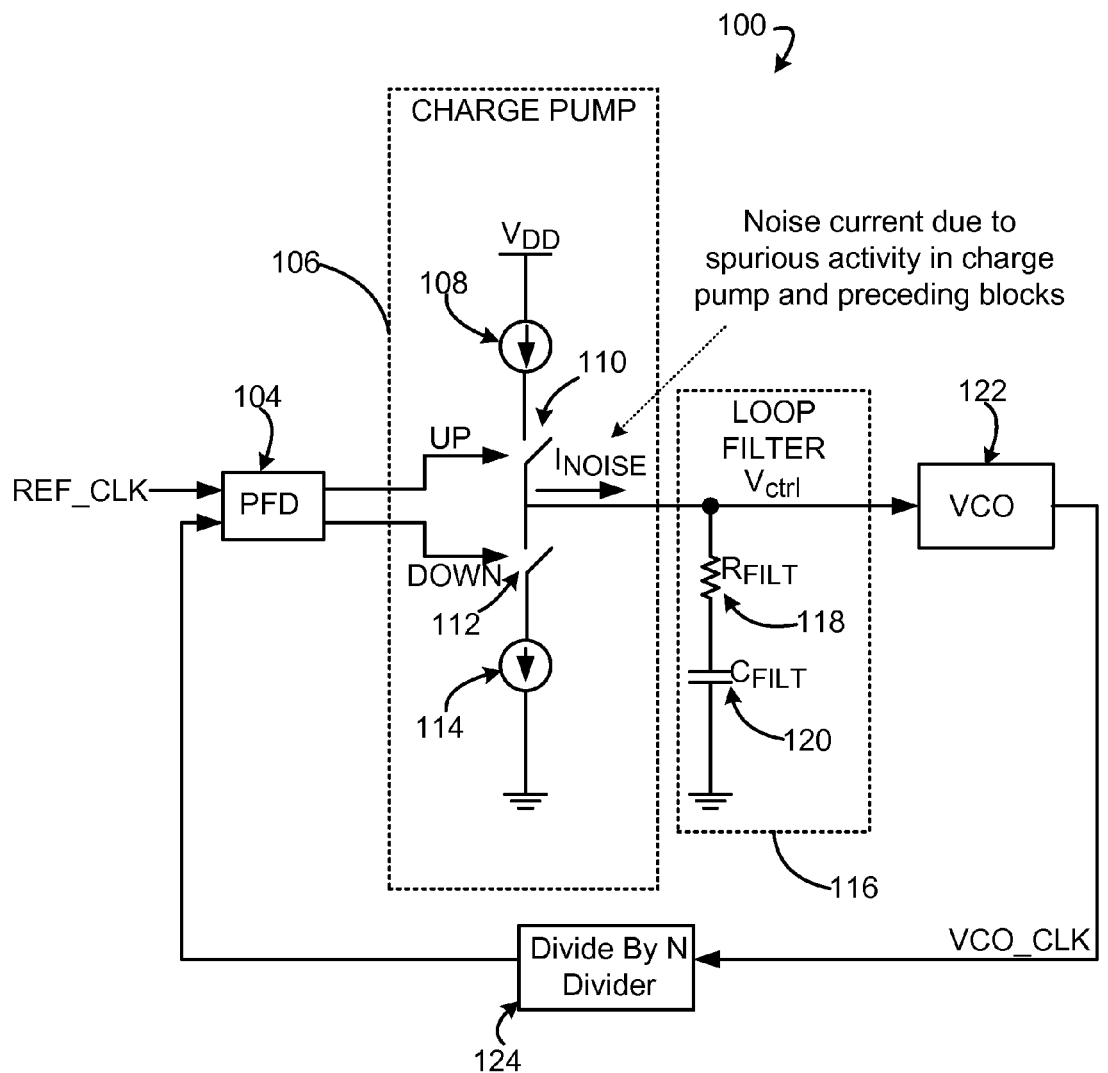
FIG. 1 shows an example schematic diagram of a typical phase lock loop (PLL) circuit employing a charge pump.

To facilitate understanding, identical reference numerals have been used, where possible to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any configuration or design described herein as "exemplary" is not necessarily to be construed as preferred or advantageous over other embodiments or designs.

Figure 3:
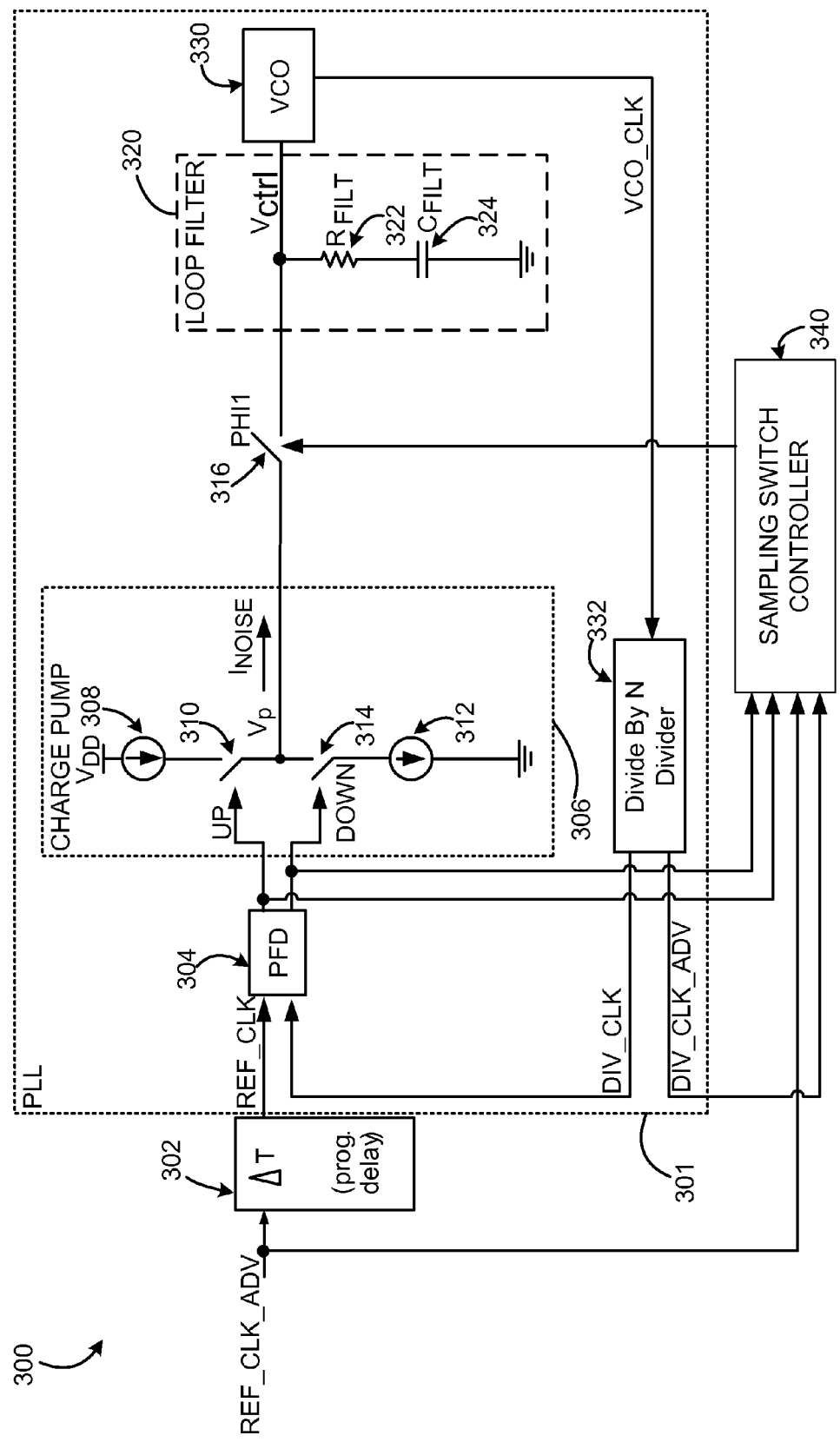
FIG. 3 shows an example schematic diagram of an apparatus having charge-pump phase lock loop (PLL) circuit with adaptive control of a loop filter sampling interval to mitigate the effects of charge pump output noise current.

FIG. 3 shows a schematic diagram of an apparatus 300 having a charge-pump phase lock loop (PLL) circuit 301 with adaptive control of a loop filter sampling interval to mitigate the effects of a charge pump output noise current. The apparatus 300 includes a charge-pump PLL circuit 301, a programmable delay 302 and a sampling switch controller 340. The programmable delay 302 receives an advanced version of a reference clock signal, denoted as REF_CLK_ADV. The advanced version of the reference clock signal is hereinafter referred to as an "advanced reference clock signal." An output of the programmable delay 302 represents the reference clock signal, denoted as REF_CLK, which is an input into the PLL circuit 301.

The PLL circuit 301 includes a phase frequency detector (PFD) 304, a charge pump 306, a loop filter 320, a voltage (or current) controlled oscillator (VCO) 330 and a divide-by-N divider 332. In operation, the PFD 304 detects a phase error, via a phase comparison, between the reference clock signal REF_CLK and a divided output clock from the divide-by-N divider 332. The PFD 304 generates and outputs UP and DOWN pulses which drive the charge pump 306.

The advanced reference clock signal REF_CLK_ADV, and advanced divider clock signal DIV_CLK_ADV, and the UP and DOWN pulses are sent to a sampling switch controller 340. The output of sampling switch controller, denoted as PHI1, is configured to synchronize a sampling interval of the loop filter 320 via sampling switch 316 (depicted in an open state). The sampling switch 316 is positioned between the charge pump 306 output and the loop filter 320 input. In one configuration, the sampling switch controller 340 is a state machine.

The charge pump 306 injects a charge proportional to a detected phase error into the loop filter 320 when the sampling switch 316 is closed. The loop filter 320 then generates a control voltage $V_{ctrl}$ (or current) that is a frequency control input to the VCO 330. The VCO 330 generates a VCO output signal, denoted as VCO_CLK, whose frequency is proportional to the control voltage $V_{ctrl}$ (or current).

The PLL circuit 301 has a locked condition and a lock acquisition phase to achieve the locked condition. In the locked condition, the UP and DOWN pulses are of substantially equal duration and no net charge is injected into the loop filter 320. Hence the control voltage (or current) $V_{ctrl}$ is ideally at a constant value which ensures that the VCO 330 output signal VCO_CLK is at a constant frequency.

The loop filter 320 may include a capacitor ($C_{FILT}$) 324 and a resistor ($R_{FILT}$) 322 which accumulates charge to produce a control voltage that "sets" a control frequency which provides a correction voltage (if needed) at every phase comparison. It should be noted that the PFD 304 is clocked by the reference clock signal REF_CLK, i.e. the phase comparisons occur at reference frequency intervals.

The apparatus 300 may further include an external reference oscillator (not shown). The advanced reference clock signal REF_CLK_ADV is a function of a clock signal from the external reference oscillator (not shown) and may be a fraction of the external reference oscillator, the fraction being derived by a divider (not shown) in a path between the external reference oscillator and the programmable delay 302.

The loop filter 320 is only exemplary and may also include other components and other designs. For example, commonly an extra pole capacitor (not shown) is added in the loop filter 320. The extra pole capacitor may be 1/10 the value of capacitor 324. The extra pole capacitor does not affect PLL 301 settling time or loop stability, but improves reference spur rejection in the VCO 330 output signal. Likewise, the charge pump configuration is only exemplary.

From a output noise current perspective, a sampling operation corresponding to the loop filter sampling interval should have of a minimum duration, i.e. the loop filter 320 is connected to the charge pump only when the UP or DOWN pulses are active (ON) and disconnected otherwise. In the locked condition, the UP and DOWN pulses are of minimum duration, i.e. a minimum pulse width is always maintained for both pulses to avoid an appearance of a dead-zone whereby the PFD 304 does not respond to very small phase errors. However, during a lock acquisition phase, the UP and DOWN pulses can be very long (a significant fraction of the reference cycle) which also sets a minimum constraint on a duration of the sampling operation by the sampling switch 316. If sampling switch 316 is turned off while the UP and DOWN pulses are still active (ON), some of the error charge is "lost" and the effective loop gain is reduced. Thereby, loop dynamics are changed and stability issues may arise.

The apparatus 300 described herein may be used for various electronics circuits including communication circuits. For example, the apparatus 300 may be used in (1) a transmitter subsystem to generate a local oscillator (LO) signal used for frequency upconversion, (2) a receiver subsystem to generate an LO signal used for frequency downconversion, (3) a digital subsystem to generate clock signals used for synchronous circuits such as flip-flops and latches, and (4) other circuits and subsystems.

Figure 4:
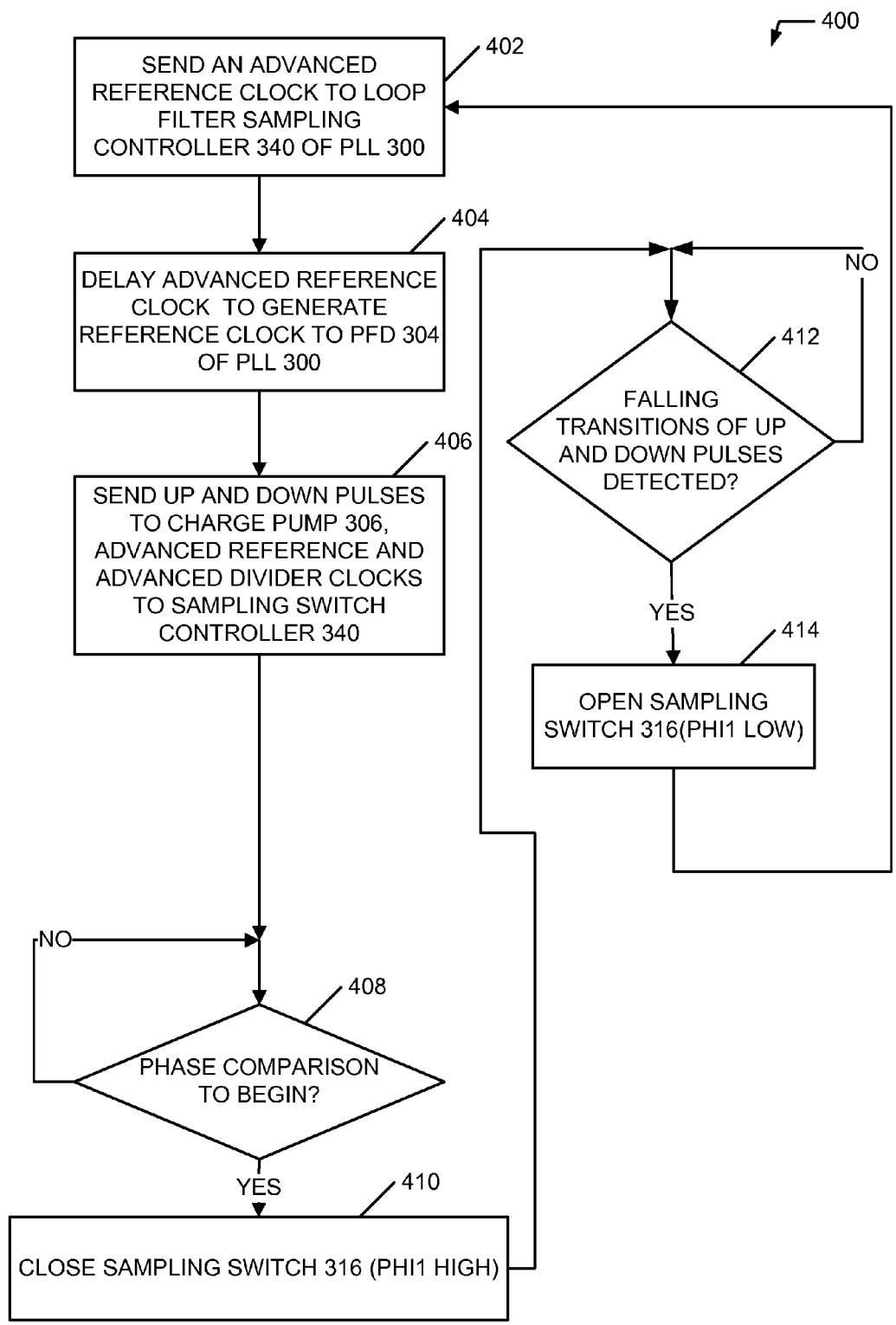
FIG. 4 shows a flowchart of an example process for adaptive control of a sampling interval for the loop filter.

FIG. 4 shows a flowchart of an example process 400 for adaptive control of a loop filter sampling interval, for the apparatus 300 of FIG. 3, of loop filter 320 to minimize the time the loop filter 320 is connected to any potential output noise current paths in a charge pump 306. The process 400 may be implemented in a hardware state machine or hardware logic function. The sampling interval is controlled by a sampling switch controller 340. In the exemplary embodiment, sampling switch 316 is synchronized to open and close, via the switch controller 340, in accordance with the process 400.

The process 400 begins with sending an advanced reference clock signal REF_CLK_ADV to the sampling switch controller 340 of block 402. At block 404, the advanced reference clock signal REF_CLK_ADV is delayed by a programmable delay 302 to generate the reference clock signal REF_CLK to PFD 304. At block 406, the PFD 304 sends UP and DOWN pulses to the charge pump 306 and to the sampling switch controller 340. Divide by N Divider 332 sends advanced divider clock DIV_CLK_ADV to the sampling switch controller 340.

At block 408, a determination is made whether the phase comparison (or next cycle) is to begin. If the determination is NO, the process 400 loops to the beginning of block 408. However, if the determination at block 408 is YES, sampling switch 316 is closed (PHI1 HIGH) at block 410 which corresponds to the beginning of the loop filter sampling interval.

At block 412, a determination is made whether falling transitions of both UP and DOWN pulses have been detected. If the determination is NO, block 412 loops back to the beginning of block 412. However, if the determination is YES, the sampling switch 316 is opened at block 414 which corresponds to the end of the loop filter sampling interval. Block 414 loops back to block 402.

The process 400 adaptively controls the width of the loop filter sampling interval (duration the sampling switch 316 is closed) based on a length of the UP and DOWN pulses, i.e. the loop filter sampling interval is automatically adjusted to accommodate for long UP/DOWN pulses (during the lock acquisition phase) and to accommodate for a minimum length UP/DOWN pulses (in the locked condition).

The reference clock signal REF_CLK to the PLL circuit 300 is delayed by a programmable amount. The sampling switch controller 340 is clocked when the advanced reference clock signal REF_CLK_ADV or advanced divider clock signal DIV_CLK_ADV is turned ON where the sampling switch 316 is closed just before the phase comparison instant. The sampling switch controller 340 then waits for the falling transitions of the UP and DOWN pulses to occur—once both these events are detected, the sampling switch 316 is opened. Thus, process 400 ensures that substantially all the error charge has been sampled onto the loop filter 320 while simultaneously minimizing the time for which the loop filter 320 is connected to any potential output noise current from the charge pump 306. A resultant control voltage $V_{ctrl}$ remains constant once the sampling switch 316 is opened until the next phase comparison where the advanced reference clock REF_CLK_ADV or the advanced divider clock DIV_CLK_ADV (whichever occurs first) is turned ON.

Figure 5:
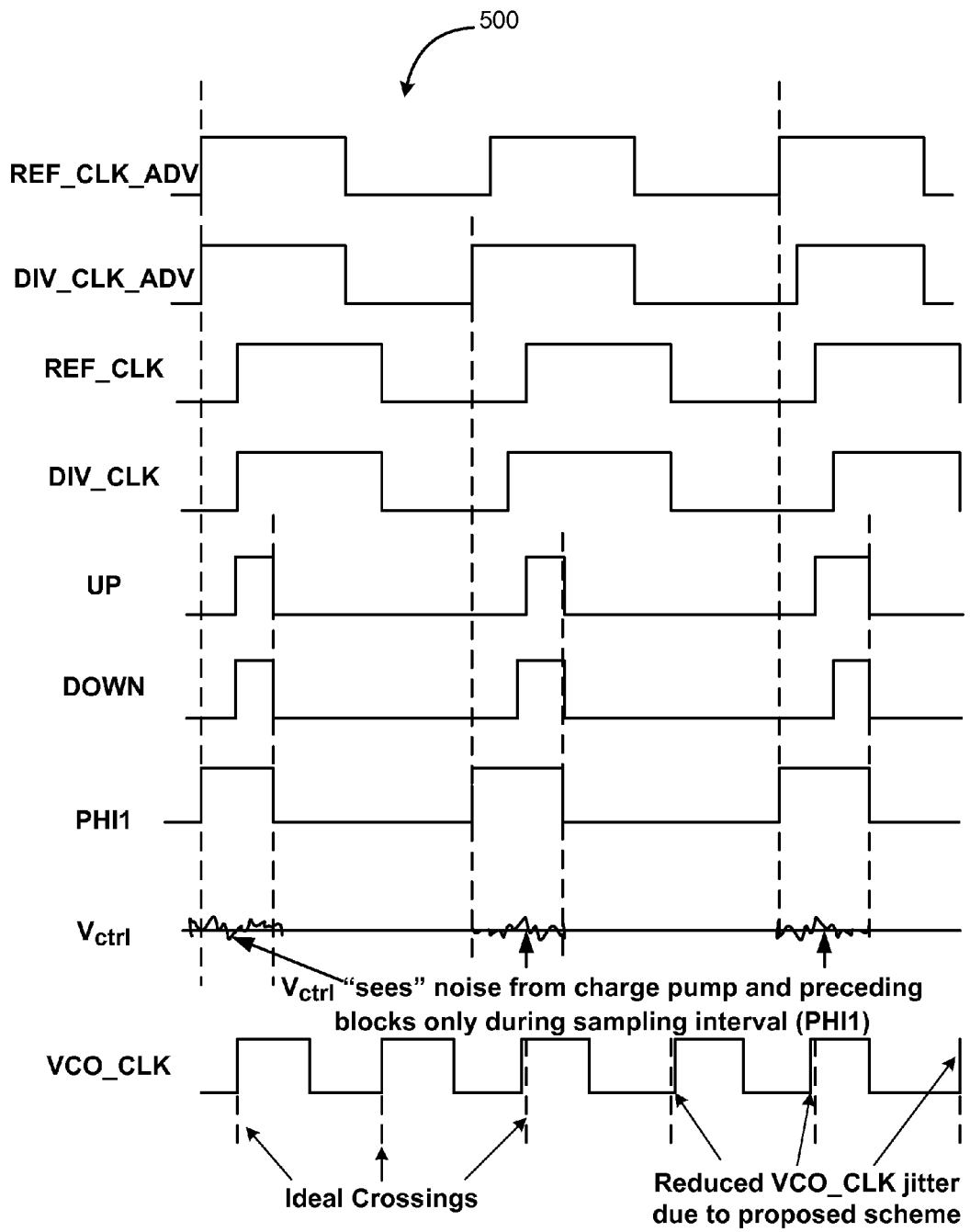
FIG. 5 shows a set of waveforms for an advanced reference clock, an advanced divider clock, a reference clock, a divider clock, UP and DOWN pulses, switch control signal PHI1, and VCO control voltage $V_{ctrl}$ according to the apparatus of FIG. 3.

FIG. 5 shows a set of waveforms 500 for an advanced reference clock signal REF_CLK_ADV, an advanced divider clock signal DIV_CLK_ADV, a reference clock signal REF_CLK, reference divider clock signal DIV_CLK, UP and DOWN pulses, switch control PHI1, a control voltage $V_{ctrl}$, and a VCO 122 output clock VCO_CLK associated with the apparatus 300 of FIG. 3.

The switch control PHI1 is a synchronized sampling switch control that has a rising transition that corresponds to the rising transition of the advanced reference clock signal REF_CLK_ADV or the advanced divider clock signal DIV_CLK_ADV (whichever occurs first) Moreover, the falling transitions of the UP and DOWN pulses and the switch control PHI1 coincide. In operation, the sampling switch controller 340 switches ON (closes) the sampling switch 316 (corresponding to the rising transition of the switch control PHI1) based on the advanced reference clock signal REF_CLK_ADV or the advanced divider clock signal DIV_CLK_ADV being ON (whichever occurs first). Furthermore, the sampling switch controller 340 switches OFF (opens) the sampling switch 316 (corresponding to the falling transition of the switch control PHI1) which is synchronized to correspond to the falling transition of the UP and DOWN pulses. Thus, the sampling switch 316 is turned ON just before the phase comparison operation by the PFD 304 takes place and turned OFF once the phase comparison operation is completed.

Figure 2:
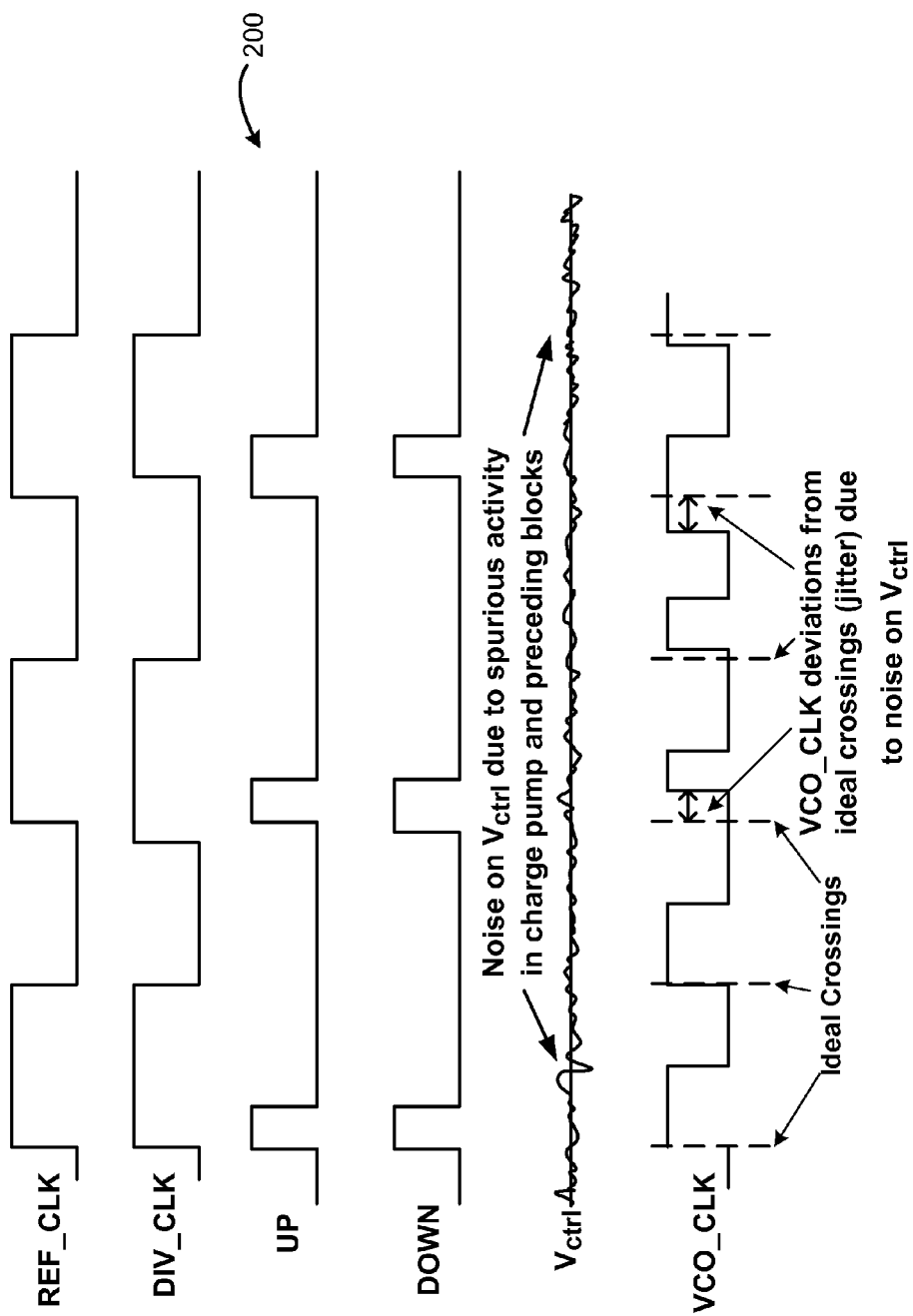
FIG. 2 shows an example set of waveforms for a reference clock, a divider clock, a VCO clock, UP and DOWN pulses, and a control voltage "noise" associated with the PLL circuit of FIG. 1.

In operation, the noise on the control voltage $V_{ctrl}$, represented by the bursts of noise during the sampling intervals, is limited to the duration between a rising transition of the advanced reference clock signal REF_CLK_ADV to an ON state and rising transitions of the UP or DOWN pulse. Thereafter, the control voltage $V_{ctrl}$ is essentially constant with minimal noise until the next rising transition of the advanced reference clock signal REF_CLK_ADV to an ON state. The waveform showing Vctrl noise in FIG. 5 is reduced relative to the apparatus 100 of FIG. 1 with the waveform showing Vctrl noise in FIG. 2 by the active (high) duty cycle of the PHI1 sampling clock interval. In the locked condition, the duty cycle is limited by the minimum pulse width of UP and DOWN signals relative the REF_CLK period. Ideally, the PHI1 duty cycle can be as low as 0%, but in practice the PHI1 duty cycle is limited to a few % by the dead-zone of the tuning voltage VCO 330 when operating in conjunction with PLL 301.

The apparatus 300 described therein mitigates the effect of charge pump leakage noise current in a PLL 300 utilizing process 400 and timing diagram 500. Additionally, the apparatus 300 decouples the charge pump 306 output from the loop filter 320 and VCO 330 at all times other than the phase comparison instant. In instances where there is power supply noise present at the charge pump 306 ($V_{DD}$ node), the power supply noise will be further mitigated by the PHI1 active duty cycle (portion of the PHI1 clock period that is high in %).

The apparatus 300 described herein may be used for various systems and applications. For example, the apparatus 300 may be used for wireless communication systems such as cellular systems, orthogonal frequency division multiple access (OFDMA) systems, multiple-input multiple-output (MIMO) systems, wireless local area networks (WLANs), and so on. The cellular systems include Code Division Multiple Access (CDMA) systems, Global System for Mobile Communications (GSM) systems, and so on. The CDMA systems include IS-95, IS-2000, IS-856, and Wideband-CDMA (W-CDMA) systems. The apparatus 300 may be embedded in a wireless device as well as a base station. For a time division duplexed (TDD) system that transmits and receives at different times, such as a GSM system or an IEEE 802.11 system, one apparatus 300 with the PLL circuit 301 may be used for both the transmit and receive paths. For a frequency division duplexed (FDD) system that transmits and receives at the same time on different frequency bands, such as a CDMA system, one apparatus 300 with the PLL circuit 301 may be used for the transmit path and another may be used for the receive path.

The apparatus 300 described herein may be implemented in various configurations. For example, all or many of the circuit blocks for the apparatus 300 and/or PLL circuit 301 may be implemented within an integrated circuit (IC), an RF integrated circuit (RFIC), an application specific integrated circuit (ASIC), and so on. The apparatus 300 may also be implemented with a combination of one or more ICs, discrete components, and so on. The apparatus 300 may also be fabricated with various IC process technologies such as complementary metal oxide semiconductor (CMOS), bipolar junction transistor (BJT), bipolar-CMOS (BiCMOS), silicon germanium (SiGe), gallium arsenide (GaAs), and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
    a voltage controlled oscillator (VCO);
    an advanced reference clock configured to output an advanced reference clock signal;
    a programmable delay coupled to advanced reference clock configured to delay the advanced reference clock signal to produce a reference clock signal;
    a divider circuit coupled to the VCO and configured to receive a signal from the VCO and to output a divider clock signal and an advanced divider clock signal;
    a phase frequency detector (PFD) coupled to the programmable delay and to the divider, and configured to:
        receive the divider clock signal;
        receive the reference clock signal;
        provide a phase comparison operation; and
        output an UP pulse and a DOWN pulse;
    a loop filter configured to generate a control voltage to lock the VCO to a desired operating frequency;
    a charge pump configured to generate an output signal to the loop filter in response to at least one of the UP pulse and the DOWN pulse;
    a sampling switch coupled to an input of the loop filter and an output of the charge pump, and characterized by a sampling interval; and
    a sampling switch controller coupled to the sampling switch, the advanced divider clock signal, the advanced reference clock signal, the UP pulse and the DOWN pulse, and configured to adaptively control a width of the sampling interval to mitigate effects of noise current from the charge pump by closing the sampling switch in advance of the phase comparison operation and opening the sampling switch when the phase comparison operation is completed.

2. The apparatus of claim 1, wherein the sampling switch controller is further configured to adaptively control the width of the sampling interval for a duration based on a length of both UP and DOWN pulses to the charge pump.

3. The apparatus of claim 1, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

4. The apparatus of claim 3, wherein the sampling switch controller is further configured to adaptively control the width of the sampling interval as a function of a maximum length of either the UP and DOWN pulses, depending on which of the UP pulse and the DOWN pulse is longest, in a locked condition.

5. The apparatus of claim 1, wherein the sampling switch controller is further configured to detect for falling transitions of the UP and DOWN pulses to occur; and in response to detecting the falling transitions of both the UP and DOWN pulses, control the sampling switch to open.

6. The apparatus of claim 5, wherein:
    the sampling switch controller is configured to control the sampling switch to close just before the phase comparison operation by the PFD and to open just after the phase comparison operation thereby ensuring that all error charge has been sampled onto the loop filter while simultaneously minimizing a duration for which the loop filter is connected to potential noise paths in the charge pump.

7. The apparatus of claim 6, wherein the loop filter is further configured such that the control voltage from the loop filter to the VCO remains constant once the sampling switch is opened and until a next cycle where the advanced reference clock signal or the advanced divider clock (whichever occurs first) is turned ON.

8. An integrated circuit comprising:
    a voltage controlled oscillator (VCO);
    an advanced reference clock configured to output an advanced reference clock signal;

a programmable delay coupled to the advanced reference clock and configured to delay the advanced reference clock signal to produce a reference clock signal;

a divider circuit coupled to the VCO and configured to receive a signal from the VCO and to output a divider clock signal and an advanced divider clock signal;

a loop filter configured to generate a control voltage to lock the VCO to a desired operating frequency;

a charge pump configured to generate an output signal to the loop filter in response to at least one of an UP pulse and a DOWN pulse;

a sampling switch, coupled to an input of the loop filter and an output of the charge pump, and characterized by a sampling interval; and a sampling switch controller coupled to the sampling switch, the advanced divider clock signal, the advanced reference clock signal, the UP pulse and the DOWN pulse, and configured to adaptively control a width of the sampling interval to mitigate effects of noise current from the charge pump by closing the sampling switch in advance of an ON state of the UP pulse or the DOWN pulse, depending on which of the UP pulse and DOWN pulse occurs first, and opening the sampling switch after both the UP and DOWN pulses have returned to an OFF state.

9. The integrated circuit of claim 8, wherein the sampling switch controller is further configured to adaptively control the width of the sampling interval for a duration based on a length of both the UP and DOWN pulses to the charge pump.

10. The integrated circuit of claim 8, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

11. The integrated circuit of claim 10, wherein the sampling switch controller is further configured to adaptively control the width of the sampling interval as a function of a maximum length of either the UP and DOWN pulses, depending on which of the UP pulse and the DOWN pulse is longest, in a locked condition.

12. The integrated circuit of claim 8, wherein the sampling switch controller is further configured to detect for falling transitions of the UP and DOWN pulses to occur; and in response to detecting the falling transitions of both the UP and DOWN pulses, control the sampling switch to open.

13. The integrated circuit of claim 12, further comprising:
a phase frequency detector (PFD) coupled to the programmable delay and the divider and configured to perform the phase comparison operation and produce the UP and DOWN pulses, wherein:
the sampling switch controller is configured to control the sampling switch to close just before the phase comparison operation by the PFD and to open just after the phase comparison operation thereby ensuring that all error charge has been sampled onto the loop filter while simultaneously minimizing a duration for which the loop filter is connected to potential noise paths in the charge pump.

14. The integrated circuit of claim 13, wherein the loop filter is further configured such that the control voltage from the loop filter to the VCO remains constant once the sampling switch is opened and until a next cycle where the advanced reference clock signal or the advanced divider clock (whichever occurs first) is turned ON.

15. A device configured to operate with a phase lock loop (PLL) circuit having a loop filter, a charge pump to provide an output signal to the loop filter in response to at least one of an UP pulse and a DOWN pulse, and a sampling switch coupled between the loop filter and the charge pump and characterized by a sampling interval, the device comprising a sampling switch controller coupled to the sampling switch, an advanced divider clock signal, an advanced reference clock signal, the UP pulse and the DOWN pulse, and configured to adaptively control a width of the sampling interval to mitigate effects of noise current from the charge pump by:
closing the sampling switch in advance of an ON state of the UP or DOWN pulse, depending on which of the UP pulse and the DOWN pulse occurs first; and
opening the sampling switch after both the UP and DOWN pulses have returned to an OFF state.

16. The device of claim 15, wherein the sampling switch controller is further configured to adaptively control the width of the sampling interval for a duration based on a length of both UP and DOWN pulses to the charge pump.

17. The device of claim 15, wherein the sampling switch controller is further configured to adaptively control the width of the sampling interval as a function of a longest length of either the UP and DOWN pulses, depending on which of the UP pulse and the DOWN pulse is longest, to the charge pump during a lock acquisition phase.

18. The device of claim 17, wherein the sampling switch controller is further configured to adaptively control the width of the sampling interval as a function of a maximum length of either the UP and DOWN pulses, depending on which of the UP pulse and the DOWN pulse is longest, in a locked condition of the PLL circuit.

19. The device of claim 15, wherein the sampling switch controller is further configured to detect for falling transitions of the UP and DOWN pulses to occur;
and in response to detecting the falling transitions of both the UP and DOWN pulses, control the sampling switch to open.

20. The device of claim 19, wherein the PLL circuit further includes a phase frequency detector (PFD) configured to provide a phase comparison operation and produce the UP and DOWN pulses, and
wherein the device is further configured to operate with a programmable delay wherein the sampling switch controller and the programmable delay receive the advanced reference clock signal as well as the advanced divider clock signal, the programmable delay being configured to delay the advanced reference clock signal to produce a reference clock signal to initiate the phase comparison operation,
the sampling switch controller further being configured to control the sampling switch to close just before the phase comparison operation by the PFD and to open just after the phase comparison operation thereby ensuring that all error charge has been sampled onto the loop filter while simultaneously minimizing a duration for which the loop filter is connected to potential noise paths in the charge pump.

21. The device of claim 20, wherein the loop filter is configured to generate a control voltage to lock a VCO to a desired operating frequency such that the control voltage from the loop filter to the VCO remains constant once the sampling switch is opened and until a next cycle where the advanced reference clock signal or the advanced divider clock (whichever occurs first) is turned ON.

22. A phase lock loop (PLL) circuit adapted to operate with a sampling switch controller, the PLL circuit comprising a loop filter, a charge pump configured to generate an output signal to the loop filter in response to at least one of an UP pulse and a DOWN pulse, and a sampling switch coupled between the loop filter and the charge pump and characterized by a sampling interval, the sampling switch controller being coupled to the sampling switch, an advanced divider clock signal, an advanced reference clock signal, the UP pulse and the DOWN pulse, wherein the sampling switch controller adaptively controls a width of the sampling interval to mitigate effects of output noise current from the charge pump by closing the sampling switch in advance of an ON state of the UP or DOWN pulse, depending on which of the UP pulse and the DOWN pulse occurs first, and opening the sampling switch after both the UP and DOWN pulses have returned to an OFF state.

23. The PLL circuit of claim 22, wherein the PLL circuit further includes:

a phase frequency detector (PFD) configured to provide a phase comparison operation and produce the UP and DOWN pulses, and adapted to operate with a programmable delay, wherein the sampling switch controller and the programmable delay receive the advanced reference clock signal, the programmable delay being configured to delay the advanced reference clock signal to produce a reference clock signal to initiate the phase comparison operation, and wherein the sampling switch controller closes the sampling switch just before the phase comparison operation by the PFD and opens the sampling switch just after the phase comparison operation thereby ensuring that all error charge has been sampled onto the loop filter while simultaneously minimizing a duration for which the loop filter is connected to potential noise paths in the charge pump.

24. The PLL circuit of claim 22, wherein the loop filter is configured to generate a control voltage to lock a VCO to a desired operating frequency such that the control voltage from the loop filter to the VCO remains constant once the sampling switch is opened and until a next cycle where the advanced reference clock signal or the advanced divider clock signal (whichever occurs first) is turned ON.

25. An apparatus comprising:

a phase lock loop (PLL) circuit;

a sampling switch;

means for closing the sampling switch in advance of an ON state of an UP or DOWN pulse to a charge pump from a phase frequency detector (PFD) of the PLL circuit depending on which of the UP pulse and the DOWN pulse occurs first; and means for opening the sampling switch after both the UP and DOWN pulses have returned to an OFF state to control a width of a sampling interval of the sampling switch to mitigate effects of noise current from the charge pump, the means for opening the sampling switch being directly coupled to the sampling switch, an advanced divider clock signal, an advanced reference clock signal, the UP pulse and the DOWN pulse.

26. The apparatus of claim 25, further comprising means for adaptively controlling the width of the sampling interval for a duration based on a length of both UP and DOWN pulses to the charge pump.

27. The apparatus of claim 25, further comprising means for adaptively controlling the width of the sampling interval as a function of a longest length of either the UP and DOWN pulses, depending on which of the UP pulse and the DOWN pulse is longest, to the charge pump during a lock acquisition phase.

28. The apparatus of claim 27, further comprising means for adaptively controlling the width of the sampling interval as a function of a maximum length of either the UP and DOWN pulses, depending on which of the UP pulse and the DOWN pulse is longest, in a locked condition of the PLL circuit.

29. The apparatus of claim 25, further comprising means for detecting falling transitions of the UP and DOWN pulses; and means for, in response to detecting the falling transitions of both the UP and DOWN pulses, controlling the sampling switch to open.

30. The apparatus of claim 29, further comprising means for controlling the sampling switch to close just before a phase comparison operation by the PFD and to open just after the phase comparison operation thereby ensuring that all error charge has been sampled onto a loop filter of the PLL circuit while simultaneously minimizing a duration for which the loop filter is connected to potential noise paths in the charge pump.

31. The apparatus of claim 30, further comprising means for generating a control voltage to lock a VCO to a desired operating frequency such that the control voltage is held constant once the sampling switch is opened until a next cycle where the advanced reference clock signal or the advanced divider clock (whichever occurs first) is turned ON.

32. A method for mitigating the effects of noise current from a charge pump of a phase lock loop (PLL) circuit, the method comprising:

closing a sampling switch in advance of an ON state of an UP or DOWN pulse to the charge pump from a phase frequency detector (PFD) of the PLL circuit depending on which of the UP pulse and the DOWN pulse occurs first; and opening the sampling switch after both the UP and DOWN pulses have returned to an OFF state to control a width of a sampling interval of the sampling switch to mitigate the effects of the noise current from the charge pump of the PLL circuit, wherein the opening of the sampling switch is controlled by a sampling switch controller directly coupled to the sampling switch, an advanced divider clock signal, an advanced reference clock signal, the UP pulse and the DOWN pulse.

33. The method of claim 32, further comprising controlling the width of the sampling interval for a duration based on a length of both UP and DOWN pulses to the charge pump.

34. The method of claim 32, further comprising controlling the width of the sampling interval as a function of a longest length of either of the UP and DOWN pulses, depending on which of the UP pulse and the DOWN pulse is longest, to the charge pump during a lock acquisition phase.

35. The method of claim 34, further comprising controlling the width of the sampling interval as a function of a maximum length of either of the UP and DOWN pulses, depending on which of the UP pulse and the DOWN pulse is longest, in a locked condition of the PLL circuit.

36. The method of claim 32, further comprising detecting falling transitions of the UP and DOWN pulses; and in response to the detecting of the falling transitions of both the UP and DOWN pulses, controlling the sampling switch to open.

37. The method of claim 36, further comprising controlling the sampling switch to close just before a phase comparison operation by the PFD and to open just after the phase comparison operation thereby ensuring that all error charge has been sampled onto a loop filter of the PLL circuit while simultaneously minimizing a duration for which the loop filter is connected to potential noise paths in the charge pump.

38. The method of claim 37, further comprising generating a control voltage to lock a VCO to a desired operating frequency such that the control voltage is held constant once the sampling switch is opened until a next cycle where the advanced reference clock signal or the advanced divider clock (whichever occurs first) is turned ON.

* * * * *